US012727265B2

(12) United States Patent
Kawai et al.

(10) Patent No.: US 12,727,265 B2
(45) Date of Patent: Sep. 1, 2026

(54) IMAGING ELEMENT AND IMAGING APPARATUS

(71) Applicant: FUJIFILM Corporation, Tokyo (JP)

(72) Inventors: Tomoyuki Kawai, Saitama (JP); Yoshinori Furuta, Saitama (JP); Kazuya Oda, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 499 days.

(21) Appl. No.: 18/326,012

(22) Filed: May 31, 2023

(65) Prior Publication Data

US 2024/0006428 A1 Jan. 4, 2024

(30) Foreign Application Priority Data

Jun. 30, 2022 (JP) ................................ 2022-106126

(51) Int. Cl.
*H10F 39/00* (2025.01)
*H10F 39/18* (2025.01)

(52) U.S. Cl.
CPC ......... *H10F 39/8027* (2025.01); *H10F 39/18* (2025.01); *H10F 39/8057* (2025.01)

(58) Field of Classification Search
CPC ...... H10F 39/8027; H10F 39/18; H10F 39/12; H10F 39/802; H10F 39/8023; H10F 39/8037; H10F 39/8057
See application file for complete search history.

(56) References Cited

U.S. PATENT DOCUMENTS

| | | | |
|---|---|---|---|
| 8,587,702 | B2 | 11/2013 | Hara |
| 9,224,771 | B2 | 12/2015 | Yamashita et al. |
| 9,941,314 | B2 | 4/2018 | Okuno et al. |
| 9,986,186 | B2 | 5/2018 | Machida et al. |
| 10,002,894 | B2 | 6/2018 | Yamashita et al. |
| 10,313,618 | B2 | 6/2019 | Machida et al. |
| 10,484,632 | B2 | 11/2019 | Kobayashi |
| 10,510,786 | B2 | 12/2019 | Okuno et al. |
| 10,559,608 | B2 | 2/2020 | Okuno et al. |
| 10,559,609 | B2 | 2/2020 | Okuno et al. |
| 10,594,969 | B2 | 3/2020 | Machida et al. |

(Continued)

FOREIGN PATENT DOCUMENTS

| | | |
|---|---|---|
| JP | 2012147141 | 8/2012 |
| JP | 2013172210 | 9/2013 |

(Continued)

OTHER PUBLICATIONS

"Notice of Reasons for Refusal of Japan Counterpart Application", issued on Dec. 2, 2025, with English translation thereof, p. 1-p. 8.

*Primary Examiner* — Tucker J Wright
(74) *Attorney, Agent, or Firm* — JCIPRNET

(57) ABSTRACT

An imaging element includes plural pixels in each of which a photoelectric conversion unit and a charge holding unit that holds charges transferred from the photoelectric conversion unit are arranged in a first direction, the plural pixels include a first pixel, in the photoelectric conversion unit of the first pixel, a light-receiving region and a light shielding region are arranged in a second direction intersecting with the first direction, and a width of the photoelectric conversion unit in the second direction is larger than a width of the charge holding unit in the second direction.

10 Claims, 9 Drawing Sheets

(56) References Cited

U.S. PATENT DOCUMENTS

| | | | | |
|---|---|---|---|---|
| 10,819,900 | B2 | 10/2020 | Kobayashi et al. | |
| 10,998,356 | B2 | 5/2021 | Okuno et al. | |
| 10,999,545 | B2 | 5/2021 | Machida et al. | |
| 11,127,770 | B2 | 9/2021 | Yamashita et al. | |
| 11,184,523 | B2 | 11/2021 | Kobayashi et al. | |
| 11,496,666 | B2 | 11/2022 | Kobayashi et al. | |
| 11,621,285 | B2 | 4/2023 | Okuno et al. | |
| 11,678,088 | B2 | 6/2023 | Machida et al. | |
| 12,192,659 | B2 | 1/2025 | Asakura | |
| 12,445,750 | B2 | 10/2025 | Machida et al. | |
| 2013/0194471 | A1* | 8/2013 | Yamashita | H10F 39/813 348/308 |
| 2013/0214128 | A1* | 8/2013 | Yamashita | H04N 25/704 250/208.1 |
| 2020/0007805 | A1 | 1/2020 | Machida et al. | |

FOREIGN PATENT DOCUMENTS

| | | |
|---|---|---|
| JP | 2018207548 | 12/2018 |
| JP | 2021082931 | 5/2021 |
| WO | 2016098624 | 6/2016 |
| WO | 2018061497 | 4/2018 |
| WO | 2018168551 | 9/2018 |
| WO | 2021171717 | 9/2021 |

* cited by examiner 40
5
100
1
2
IMAGING ELEMENT
15
16
MEMORY CONTROLLER
MEMORY
DIGITAL SIGNAL PROCESSING SECTION
17
24
25
8
9
21
20
LENS DRIVE UNIT
STOP DRIVE UNIT
EXTERNAL MEMORY CONTROLLER
STORAGE MEDIUM
11
4
SYSTEM CONTROLLER
LENS CONTROLLER
DISPLAY CONTROLLER
DISPLAY SURFACE
14
LENS DEVICE
OPERATION UNIT
22a
22b
DISPLAY DEVICE
100A
22

50W
61B
Y
61A
61(61W)
RW
61D
SL
50L
61(61L)
RL
CL
61B
61B
61A
61(61R)
CR
RR
50R
SR
61D
61(61W)
RW
61A
X
50
50W
61B
Lu
Ld 50W
61B
Y
61A
61(61W)
RW
61D
SL
50L
61(61L)
RL
61B
CL
61B
61A
CR
61(61R)
RR
50R
SR
61D
61(61W)
RW
61A
X
50
50W
61B
Lu
Ld

Y
X
50W
50W
50
50L
50R
61A
61A
61A
61B
61D
61D
61(61W)
61(61W)
61(61L)
61(61R)
RW
RW
SL
SR
RL
RR
G1
G2
G2
G2
61(61W)
61(61W)
61(61W)
61(61W)

IMAGING ELEMENT AND IMAGING APPARATUS

CROSS-REFERENCE TO RELATED APPLICATIONS

The present application claims priority under 35 U.S.C. § 119 to Japanese Patent Application No. 2022-106126, filed on Jun. 30, 2022. The above application is hereby expressly incorporated by reference, in its entirety, into the present application.

BACKGROUND OF THE INVENTION

1. Field of the Invention

The present invention relates to an imaging element and an imaging apparatus.

2. Description of the Related Art

JP2018-207548A discloses a solid-state imaging device including a phase difference detection pixel. The phase difference detection pixel is configured to include a photodiode and a memory unit that are arranged in an up-down direction, in which an opening portion of a light shielding film is provided in approximately half of each of the photodiode and the memory unit on a left side or on a right side.

WO2018/061497A discloses an imaging element including a phase difference detection pixel. The phase difference detection pixel includes a photoelectric conversion unit and a charge holding unit that are arranged in an up-down direction, in which an opening portion of a light shielding film is provided in approximately half of the photoelectric conversion unit on a left side or on a right side.

SUMMARY OF THE INVENTION

The disclosed technology is as follows.

(1) An imaging element comprising a plurality of pixels in each of which a photoelectric conversion unit and a charge holding unit that holds charges transferred from the photoelectric conversion unit are arranged in a first direction, in which the plurality of pixels include a first pixel, in the photoelectric conversion unit of the first pixel, a light-receiving region and a light shielding region are arranged in a second direction intersecting with the first direction, and a width of the photoelectric conversion unit in the second direction is larger than a width of the charge holding unit in the second direction.

(2) The imaging element according to (1), in which the second direction is a longitudinal direction of the imaging element.

(3) The imaging element according to (1) or (2), in which charges held in the charge holding unit of one of two of the first pixels disposed adjacent to each other in the second direction and charges held in the charge holding unit of other of the two of the first pixels are configured to be capable of being mixed in the charge holding units of the two of the first pixels.

(4) The imaging element according to any one of (1) to (3), in which the first pixel includes a first type pixel in which the light-receiving region is disposed on one side in the second direction and in which the light shielding region is disposed on the other side in the second direction, and a second type pixel in which the light-receiving region is disposed on the other side in the second direction and in which the light shielding region is disposed on the one side in the second direction, and in the first type pixel and the second type pixel disposed adjacent to each other in the second direction, the light-receiving region of the first type pixel and the light-receiving region of the second type pixel are disposed between the light shielding region of the first type pixel and the light shielding region of the second type pixel.

(5) The imaging element according to (4), in which a difference between a sum of an area of the light shielding region in the first type pixel and an area of the light shielding region in the second type pixel, and a sum of an area of the light-receiving region in the first type pixel and an area of the light-receiving region in the second type pixel is less than or equal to a threshold value.

(6) The imaging element according to (4), in which the plurality of pixels include a second pixel in which an incidence position of a principal ray of an imaging lens disposed in front of the imaging element matches a center of the light-receiving region of the photoelectric conversion unit, and a difference between a sum of an area of the light-receiving region in the first type pixel and an area of the light-receiving region in the second type pixel, and an area of the light-receiving region in the second pixel is less than or equal to a threshold value.

(7) The imaging element according to any one of (4) to (6), in which pairs of the first type pixel and the second type pixel adjacent to each other in the second direction include a first pair, and in the first pair, a boundary between the light-receiving regions is formed at an intermediate position between a center of the light-receiving region of the first type pixel and a center of the light-receiving region of the second type pixel.

(8) The imaging element according to any one of (4) to (7), in which pairs of the first type pixel and the second type pixel include a second pair, and in the second pair, an intermediate position between a center of the light-receiving region of the first type pixel and a center of the light-receiving region of the second type pixel is eccentric to an edge side of the imaging element from a boundary between the light-receiving regions.

(9) The imaging element according to (8), in which eccentricity of the intermediate position in the second pair is increased as the intermediate position is closer to an edge of the imaging element.

(10) An imaging element comprising a plurality of pixels in each of which a photoelectric conversion unit and a charge holding unit that holds charges transferred from the photoelectric conversion unit are arranged in a first direction, in which charges held in the charge holding unit of one of two of the pixels disposed adjacent to each other in a second direction intersecting with the first direction and charges held in the charge holding unit of the other of the two of the pixels are configured to be capable of being mixed in the charge holding units of the two of the pixels.

(11) An imaging element comprising a plurality of pixels in each of which a photoelectric conversion unit and a charge holding unit that holds charges transferred from the photoelectric conversion unit are arranged in a first direction, in which the plurality of pixels include a first pixel, in the photoelectric conversion unit of the first pixel, a light-receiving region and a light shielding region are arranged in a second direction intersecting with the first direction, the first pixel includes a first type pixel in which the light-receiving region is disposed on one side in the second direction and in which the light shielding region is disposed on the other side in the second direction, and a second type pixel in which the light-receiving region is disposed on the other side in the second direction and in which the light shielding region is disposed on the one side in the second direction, and in the first type pixel and the second type pixel disposed adjacent to each other in the second direction, the light-receiving region of the first type pixel and the light-receiving region of the second type pixel are disposed between the light shielding region of the first type pixel and the light shielding region of the second type pixel.

(12) An imaging apparatus comprising the imaging element according to any one of (1) to (11).

DESCRIPTION OF THE PREFERRED EMBODIMENTS

Figure 1:
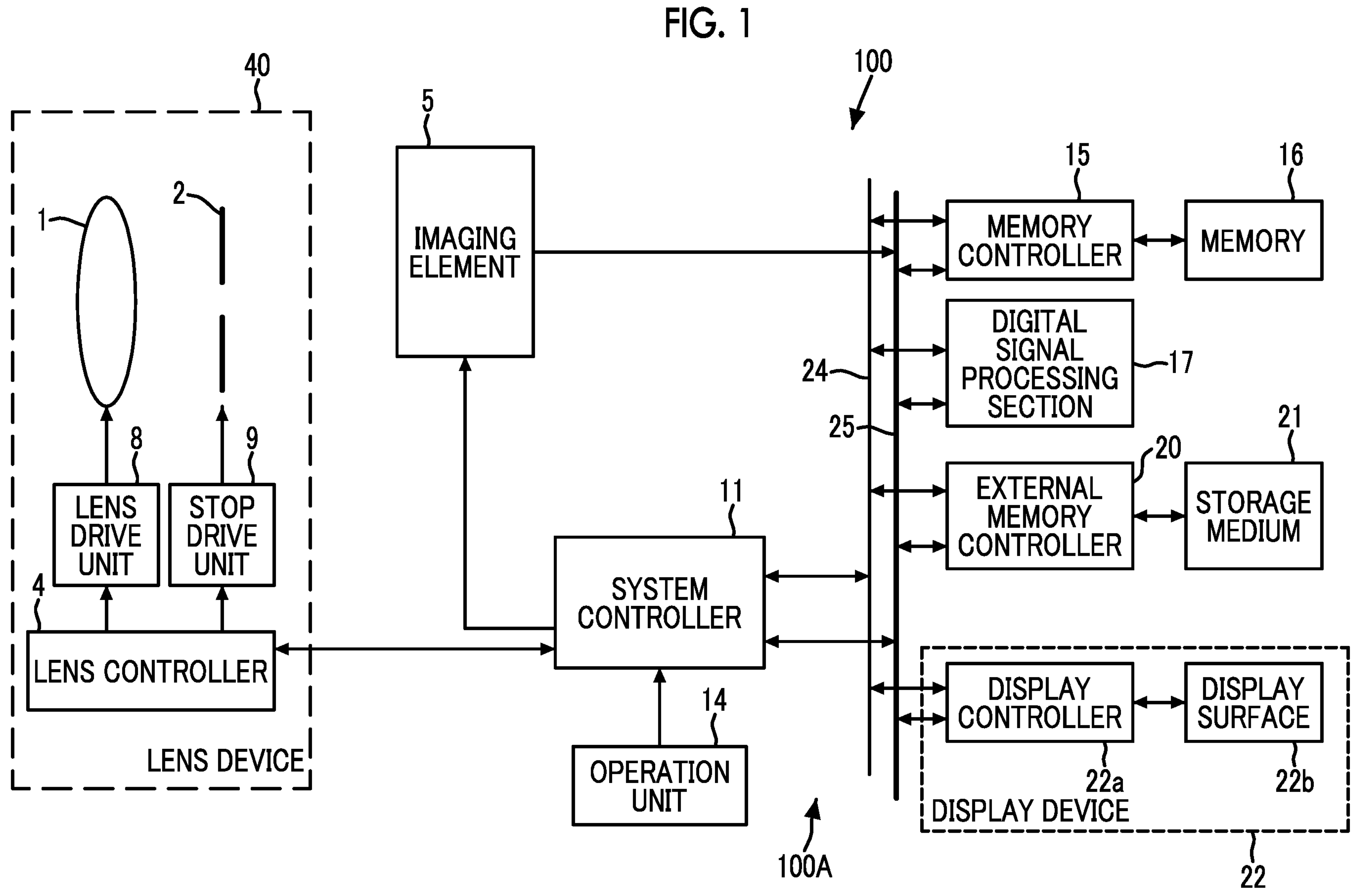
FIG. 1 is a diagram illustrating a schematic configuration of a digital camera 100 that is one embodiment of an imaging apparatus according to the present invention.

FIG. 1 is a diagram illustrating a schematic configuration of a digital camera 100 that is one embodiment of an imaging apparatus according to the present invention. The digital camera 100 illustrated in FIG. 1 comprises a lens device 40 including an imaging lens 1, a stop 2, a lens drive unit 8 that drives the imaging lens 1, a stop drive unit 9 that drives the stop 2, and a lens controller 4 that controls the lens drive unit 8 and the stop drive unit 9; and a body part 100A.

The body part 100A comprises an imaging element 5, a system controller 11 that controls the entire electric control system of the digital camera 100, an operation unit 14, a display device 22, a memory 16 including a random access memory (RAM), a read only memory (ROM), and the like, and a memory controller 15 that controls data storage in the memory 16 and data readout from the memory 16, a digital signal processing section 17, and an external memory controller 20 that controls data storage in a storage medium 21 and data readout from the storage medium 21.

The lens device 40 may be attachable to and detachable from the body part 100A or may be integrated with the body part 100A. The imaging lens 1 includes a focus lens or the like that can be moved in an optical axis direction. The focus lens is a lens for adjusting a focal point of an imaging optical system including the imaging lens 1 and the stop 2, and is composed of a single lens or of a plurality of lenses. By moving the focus lens in the optical axis direction, a position of a principal point of the focus lens changes along the optical axis direction, and a focal position on a subject side is changed. A liquid lens of which a position of a principal point in the optical axis direction can be changed by electrical control may be used as the focus lens.

The lens controller 4 of the lens device 40 changes the position of the principal point of the focus lens included in the imaging lens 1 by controlling the lens drive unit 8 based on a lens drive signal transmitted from the system controller 11. The lens controller 4 of the lens device 40 changes an amount of opening (F number) of the stop 2 by controlling the stop drive unit 9 based on a driving control signal transmitted from the system controller 11.

The imaging element 5 images a subject through the imaging optical system including the imaging lens 1 and the stop 2. The imaging element 5 includes a light-receiving surface 60 (refer to FIG. 2) on which a plurality of pixels are two-dimensionally disposed, converts a subject image formed on the light-receiving surface 60 by the imaging optical system into pixel signals via the plurality of pixels, and outputs the pixel signals. For example, a complementary metal-oxide semiconductor (CMOS) image sensor or a charge coupled device (CCD) image sensor is used as the imaging element 5. Hereinafter, an example in which the imaging element 5 is a CMOS image sensor will be described.

The system controller 11 controls the entire digital camera 100 and has a hardware structure corresponding to various processors that perform processing by executing programs. The programs executed by the system controller 11 are stored in the ROM of the memory 16.

Examples of the various processors include a central processing unit (CPU) that is a general-purpose processor performing various types of processing by executing a program, a programmable logic device (PLD) such as a field programmable gate array (FPGA) that is a processor of which a circuit configuration can be changed after manufacture, or a dedicated electric circuit such as an application specific integrated circuit (ASIC) that is a processor having a circuit configuration dedicatedly designed to execute specific processing. More specifically, the various processors have a structure of an electric circuit in which circuit elements such as semiconductor elements are combined.

The system controller 11 may be configured with one of the various processors or may be configured with a combination of two or more processors of the same type or of different types (for example, a combination of a plurality of FPGAs or a combination of a CPU and a FPGA).

The system controller 11 drives the imaging element 5 and the lens device 40 and outputs the subject image captured through the imaging optical system of the lens device 40 as an imaging signal. By processing the image signal output from the imaging element 5 via the digital signal processing section 17, captured image data that is data suitable for display on the display device 22 or is data suitable for storage in the storage medium 21 is generated.

A command signal from a user is input into the system controller 11 through the operation unit 14. The operation unit 14 includes a touch panel integrated with a display surface 22*b*, and various buttons and the like.

The display device 22 comprises the display surface 22*b* configured with an organic electroluminescence (EL) panel, a liquid crystal panel, or the like, and a display controller 22*a* that controls display on the display surface 22*b*.

The memory controller 15, the digital signal processing section 17, the external memory controller 20, and the display controller 22*a* are connected to each other through a control bus 24 and through a data bus 25 and are controlled in accordance with instructions from the system controller 11.

Figure 2:
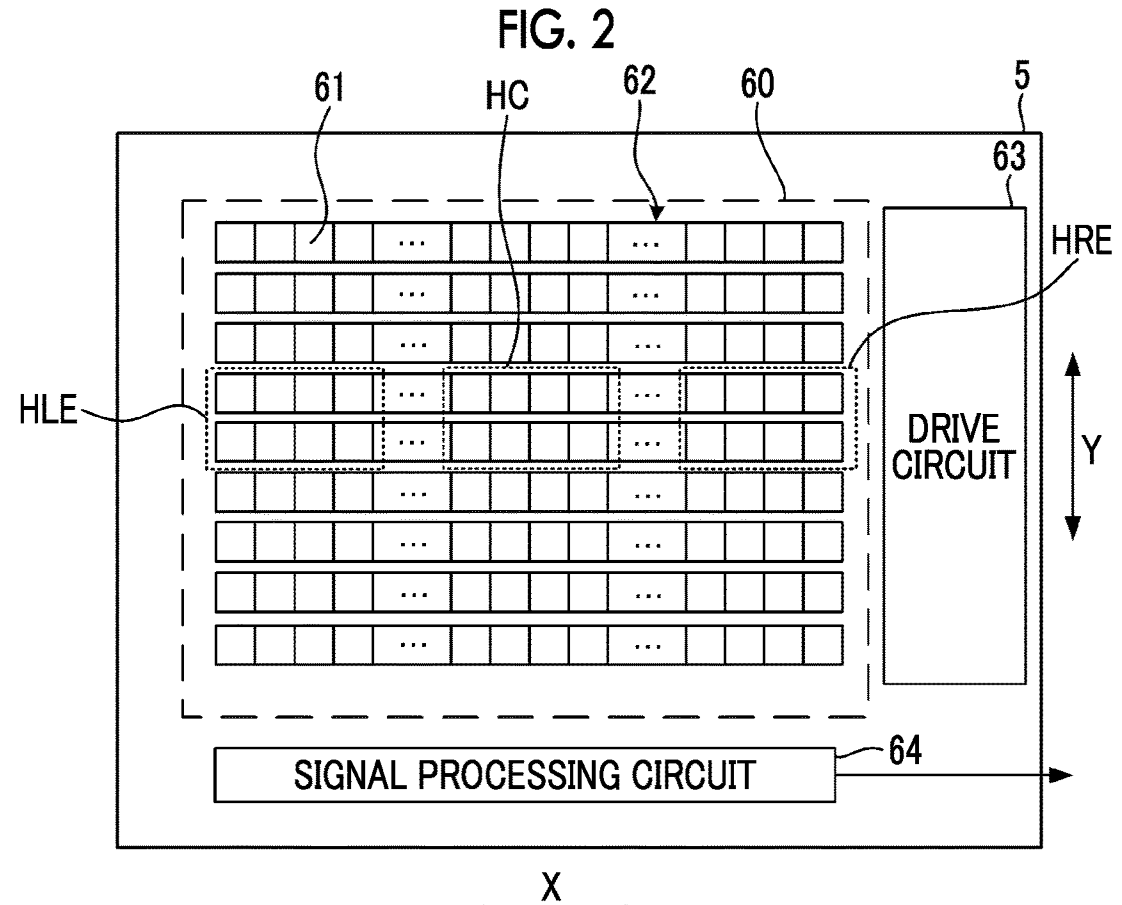
FIG. 2 is a schematic plan view illustrating a schematic configuration of an imaging element 5 illustrated in FIG. 1.
Figure 3:
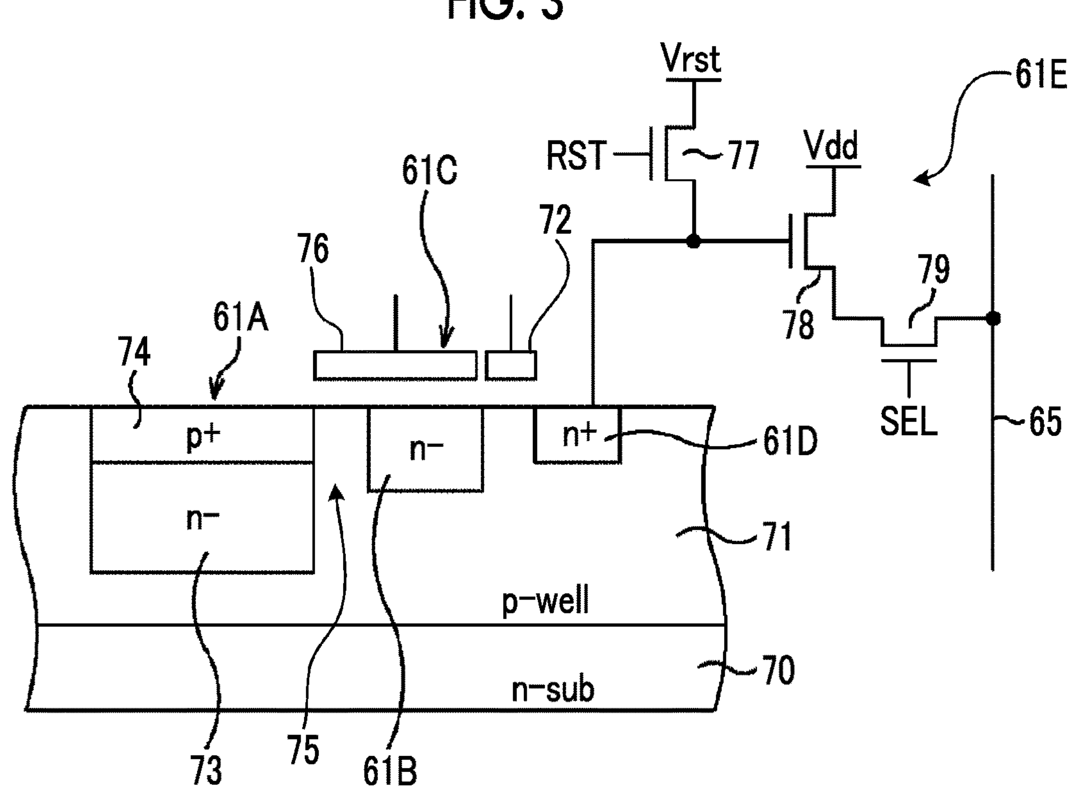
FIG. 3 is a schematic diagram illustrating a configuration of a pixel 61 of the imaging element 5 illustrated in FIG. 2.

FIG. 2 is a schematic plan view illustrating a schematic configuration of the imaging element 5 illustrated in FIG. 1. FIG. 3 is a schematic diagram illustrating a configuration of a pixel 61 of the imaging element 5 illustrated in FIG. 2.

The imaging element 5 comprises the light-receiving surface 60 on which a plurality of pixel rows 62 each consisting of a plurality of the pixels 61 arranged in a row direction X are arranged in a column direction Y intersecting with (in the example in FIG. 2, orthogonal to) the row direction X, a drive circuit 63 that drives the pixels 61 arranged on the light-receiving surface 60, and a signal processing circuit 64 that processes a pixel signal read out into a signal line from each pixel 61 of the pixel rows 62 arranged on the light-receiving surface 60. The light-receiving surface 60 has a rectangular shape of which a longitudinal direction is the row direction X. Consequently, the imaging element 5 has a rectangular shape of which a longitudinal direction is the row direction X. The column direction Y constitutes a first direction. The row direction X constitutes a second direction.

The plurality of pixels 61 include a first pixel including a first type pixel and a second type pixel, and a second pixel. The first type pixel is a phase difference detection pixel 61R, described later, that receives one of a pair of luminous fluxes which have passed through two different parts arranged in the row direction X in a pupil region of the imaging optical system of the lens device 40 and that detects a signal corresponding to an amount of received light. The second type pixel is a phase difference detection pixel 61L, described later, that receives the other of the pair of luminous fluxes and that detects a signal corresponding to an amount of received light. The second pixel is a normal pixel 61W, described later, that receives both of the pair of luminous fluxes and that detects a signal corresponding to an amount of received light.

The pixel rows 62 include a first pixel row including only the normal pixel 61W, and a second pixel row including the phase difference detection pixel 61R, the phase difference detection pixel 61L, and the normal pixel 61W. The second pixel rows are discretely disposed at equal intervals in the column direction Y.

Hereinafter, in FIG. 2, an end part on an upper side of the light-receiving surface 60 in the column direction Y will be referred to as an upper end, and an end part on a lower side of the light-receiving surface 60 in the column direction Y will be referred to as a lower end. In addition, in FIG. 2, an end part on a right side of the light-receiving surface 60 in the row direction X will be referred to as a right end, and an end part on a left side of the light-receiving surface 60 in the row direction X will be referred to as a left end.

As illustrated in FIG. 3, each pixel 61 comprises a photoelectric conversion unit 61A, a charge holding unit 61B, a charge transfer unit 61C, a floating diffusion 61D, and a readout circuit 61E.

The photoelectric conversion unit 61A receives light that has passed through the imaging optical system of the lens device 40, and generates and accumulates charges corresponding to an amount of received light. The photoelectric conversion unit 61A is configured with a photodiode or the like. In the example in FIG. 3, a P-well layer 71 is formed on a surface of an N-type substrate 70, and the photoelectric conversion unit 61A is formed in a surface part of the P-well layer 71. The photoelectric conversion unit 61A is configured with an N-type impurity layer 73 and with a P-type impurity layer 74 formed on the N-type impurity layer 73. The N-type substrate 70 and the P-well layer 71 constitute the semiconductor substrate.

The charge transfer unit 61C transfers the charges accumulated in the photoelectric conversion unit 61A to the charge holding unit 61B. In the example in FIG. 3, the charge transfer unit 61C is configured with an impurity region in a semiconductor substrate and with an electrode formed above the impurity region. Charges are transferred from the photoelectric conversion unit 61A to the charge holding unit 61B by causing the drive circuit 63 to control a voltage applied to the electrode.

The charge holding unit 61B holds the charges transferred from the photoelectric conversion unit 61A by the charge transfer unit 61C. The charge holding unit 61B is configured with the impurity region in the semiconductor substrate. In the example in FIG. 3, the charge holding unit 61B consisting of an N-type impurity layer is formed in the surface part of the P-well layer 71 to be slightly spaced from the photoelectric conversion unit 61A.

A transfer electrode 76 is formed above a region 75 of the P-well layer 71 between the charge holding unit 61B and the photoelectric conversion unit 61A through an oxide film, not illustrated. The region 75 and the transfer electrode 76 constitute the charge transfer unit 61C.

The charges accumulated in the photoelectric conversion unit 61A can be transferred to the charge holding unit 61B by controlling a potential of the transfer electrode 76 to form a channel in the region 75. The potential of the transfer electrode 76 is controlled by the drive circuit 63.

The floating diffusion 61D is used for converting charges into signals, to which the charges held in the charge holding unit 61B are transferred. In the example in FIG. 3, the floating diffusion 61D consisting of an N-type impurity layer is formed in the surface part of the P-well layer 71 to be slightly spaced from the charge holding unit 61B. A reading electrode 72 is formed above the P-well layer 71 between the charge holding unit 61B and the floating diffusion 61D through an oxide film, not illustrated.

The charges held in the charge holding unit 61B can be transferred to the floating diffusion 61D by controlling a potential of the reading electrode 72 to form a channel in a region between the charge holding unit 61B and the floating diffusion 61D. The potential of the reading electrode 72 is controlled by the drive circuit 63.

The readout circuit 61E is a circuit that reads out a signal corresponding to a potential of the floating diffusion 61D into a signal line 65 as a pixel signal. The readout circuit 61E is driven by the drive circuit 63.

In the example in FIG. 3, the readout circuit 61E is configured with a reset transistor 77 for resetting the potential of the floating diffusion 61D, an output transistor 78 that converts the potential of the floating diffusion 61D into a pixel signal and that outputs the pixel signal, and a selection transistor 79 for selectively reading out the pixel signal output from the output transistor 78 into the signal line 65. The configuration of the readout circuit is merely an example, and the present invention is not limited thereto. The readout circuit 61E may be shared by the plurality of pixels 61.

In each pixel 61, a light shielding film, not illustrated, is provided, and a region other than the photoelectric conversion unit 61A is shielded from light by the light shielding film. The structure of each pixel 61 illustrated in FIG. 3 is merely an example, and the present invention is not limited thereto.

The signal processing circuit 64 illustrated in FIG. 2 performs correlative double sampling processing on the pixel signal read out into the signal line 65 from each pixel 61 of the pixel row 62, converts the pixel signals after the correlative double sampling processing into a digital signal, and outputs the digital signal to the data bus 25 (refer to FIG. 1). The signal processing circuit 64 is controlled by the system controller 11. The digital signal processing section 17 generates the captured image data by performing signal processing such as demosaicing and gamma-correction processing on a pixel signal group output to the data bus 25 from the imaging element 5.

Figure 4:
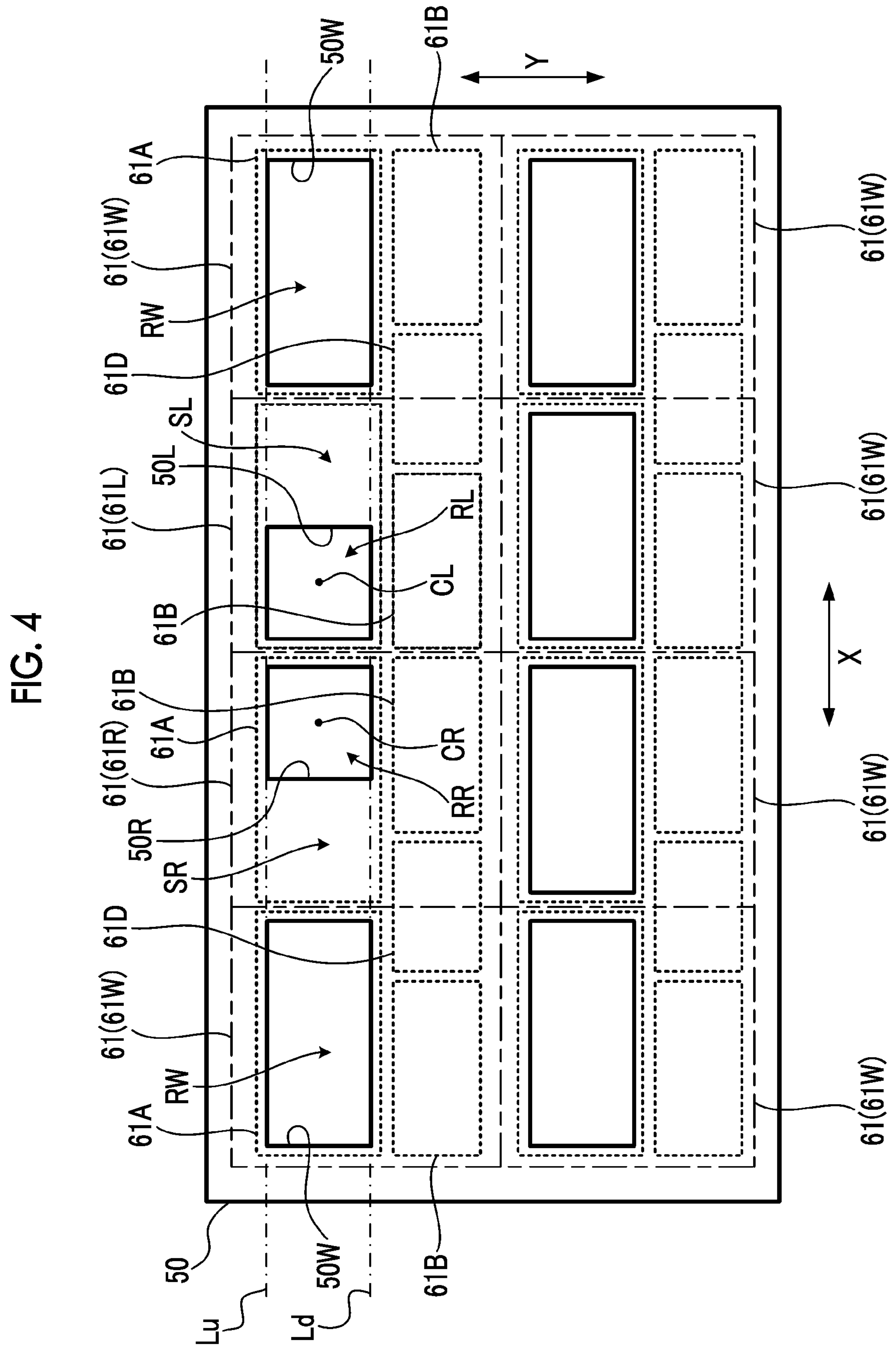
FIG. 4 is an enlarged view of a range HC of the imaging element 5 illustrated in FIG. 2.
Figure 5:
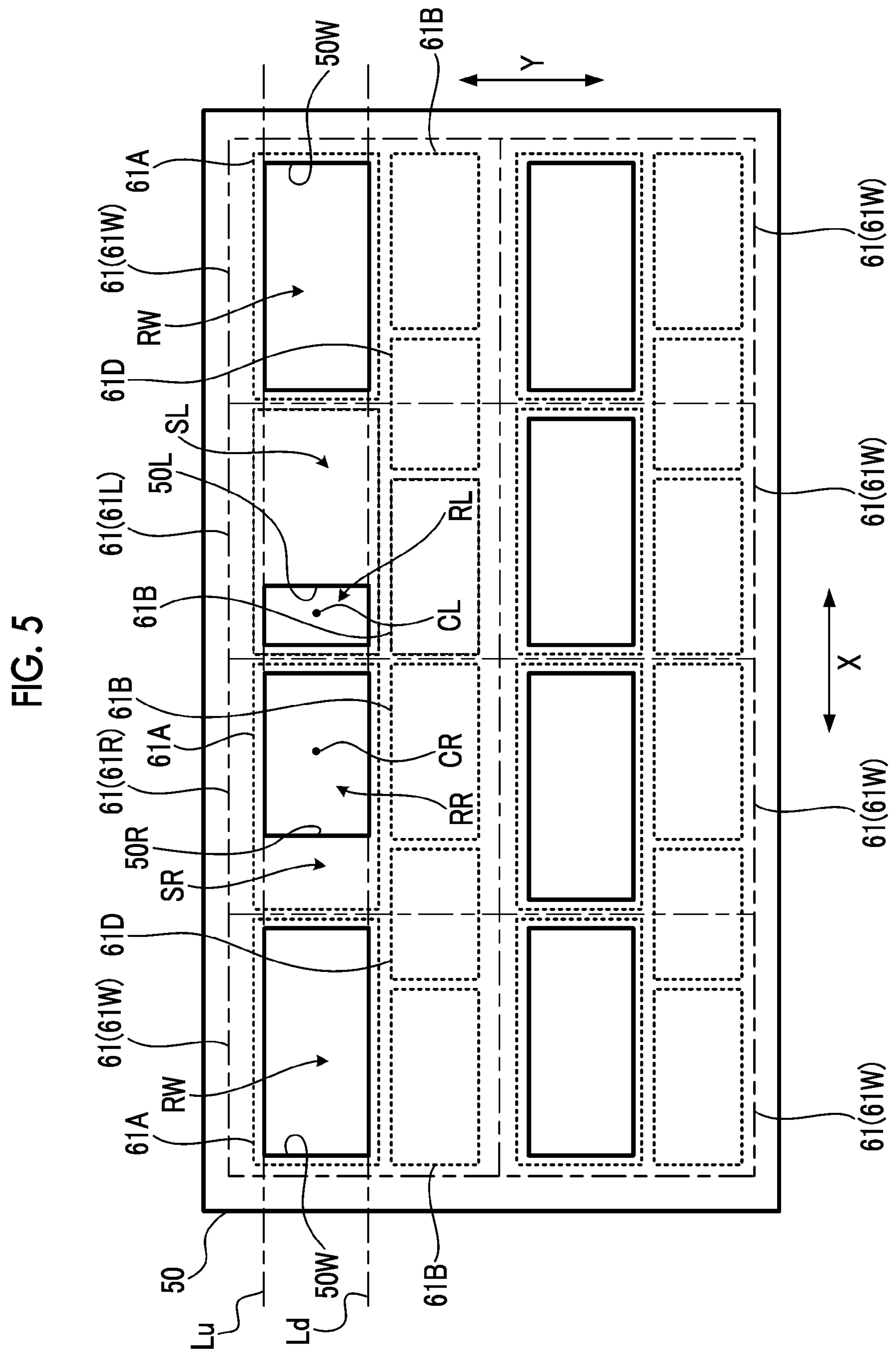
FIG. 5 is an enlarged view of a range HLE of the imaging element 5 illustrated in FIG. 2.
Figure 6:
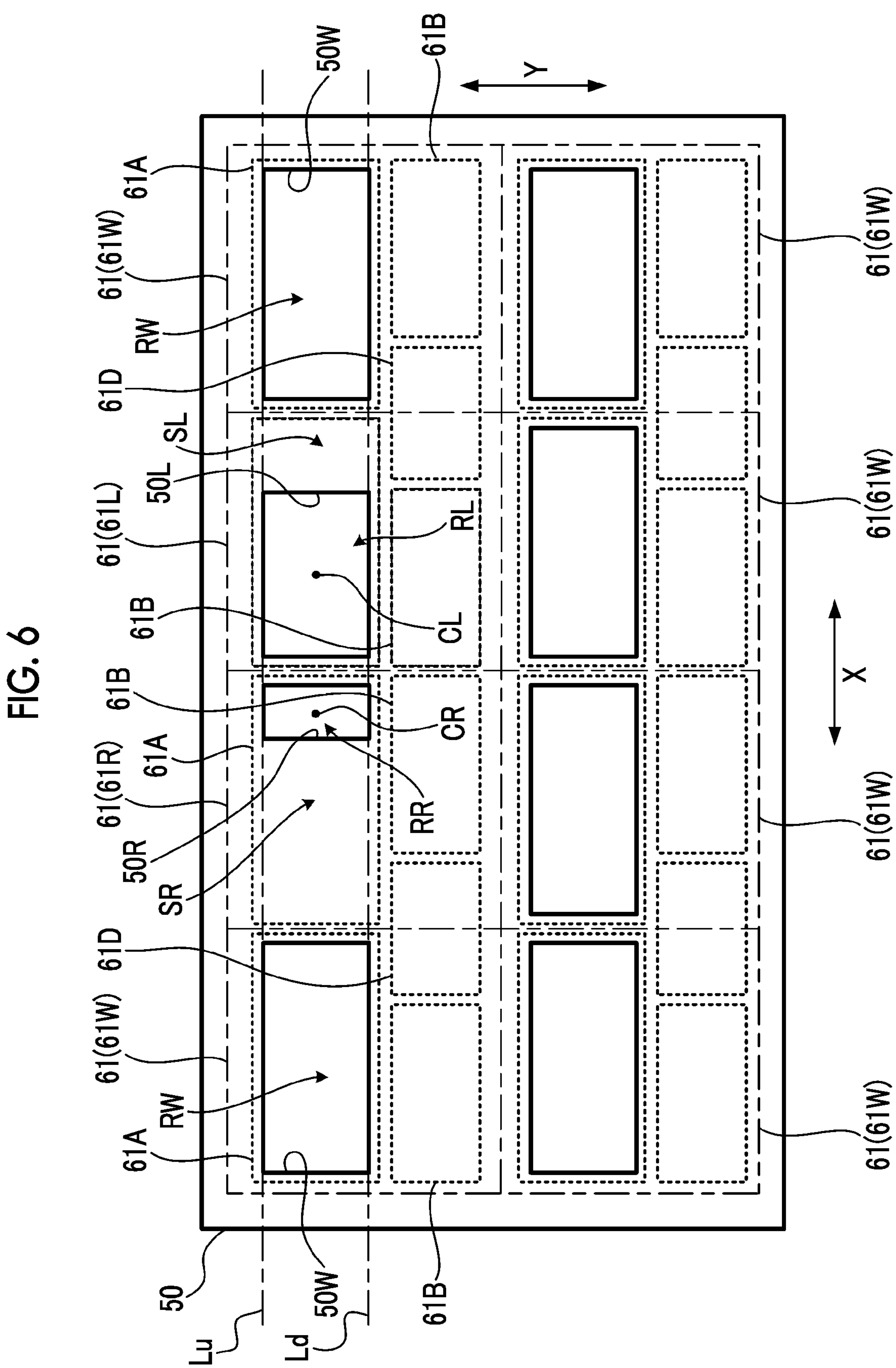
FIG. 6 is an enlarged view of a range HRE of the imaging element 5 illustrated in FIG. 2.

FIG. 4 is an enlarged view of a range HC in a center part of the imaging element 5 illustrated in FIG. 2. FIG. 5 is an enlarged view of a range HLE in an edge part (left end part) of the imaging element 5 illustrated in FIG. 2. FIG. 6 is an enlarged view of a range HRE in an edge part (right end part) of the imaging element 5 illustrated in FIG. 2. In FIG. 4, FIG. 5, and FIG. 6, the charge transfer unit 61C and the readout circuit 61E are not illustrated. Each of the range HLE, the range HC, and the range HRE includes the first pixel row (a pixel row including only the normal pixel) and the second pixel row (a pixel row including the phase difference detection pixel and the normal pixel).

The pixel row on the upper side in FIG. 4 and in FIG. 5 is the second pixel row, in which the normal pixel 61W, the phase difference detection pixel 61R, the phase difference detection pixel 61L, and the normal pixel 61W are arranged in this order in the row direction X. The pixel row on the lower side in FIG. 4 and in FIG. 5 is the first pixel row, in which four normal pixels 61W are arranged in the row direction X.

In each pixel 61, the photoelectric conversion unit 61A of a rectangular shape extending in the row direction X and the charge holding unit 61B of a rectangular shape extending in the row direction X are arranged in the column direction Y. In each pixel 61, a width of the photoelectric conversion unit 61A in the row direction X is larger than a width of the charge holding unit 61B in the row direction X.

In the pixels 61 formed on the light-receiving surface 60, a structure in the semiconductor substrate between two pixels 61 adjacent in the row direction X is axially symmetric about a boundary line between the two pixels 61 as an axis of symmetry.

For example, a set of the upper leftmost normal pixel 61W and the phase difference detection pixel 61R adjacent to the right of the normal pixel 61W in FIG. 4 is considered. In the set, while a center of the charge holding unit 61B in the row direction X is positioned on a left side of a center of the photoelectric conversion unit 61A in the row direction X in the normal pixel 61W, the center of the charge holding unit 61B in the row direction X is positioned on a right side of the center of the photoelectric conversion unit 61A in the row direction X in the phase difference detection pixel 61R. The floating diffusion 61D that is shared in the set is provided between two charge holding units 61B in the set.

In each pixel row 62 formed on the light-receiving surface 60, two pixels 61 (hereinafter, referred to as a pixel set) having the same structure as the set are repeatedly arranged in the row direction X. A configuration in which the floating diffusion 61D in the pixel set is divided at the boundary line of the pixel set, and in which one floating diffusion 61D is provided for each pixel 61 may also be used.

In the second pixel row, among four pixels 61 in two pixel sets adjacent to each other in the row direction X, two pixels 61 that are adjacent to each other across a boundary between the two pixel sets are a pair of the phase difference detection pixel 61R and the phase difference detection pixel 61L. More specifically, out of the two pixels 61, the pixel 61 on a left side is the phase difference detection pixel 61R, and the pixel 61 on a right side is the phase difference detection pixel 61L.

In the imaging element 5, for example, in each pixel 61, a principal ray of the imaging lens 1 is configured to be incident at a center of the photoelectric conversion unit 61A in the column direction Y and in the row direction X.

A light shielding film 50 is formed above the semiconductor substrate in each pixel 61. In the light shielding film 50, an opening 50W is formed above the photoelectric conversion unit 61A in the normal pixel 61W. In the normal pixel 61W, a center of the photoelectric conversion unit 61A in the column direction Y matches a center of the opening 50W in the row direction X.

In the plan view in FIG. 4, a region of the photoelectric conversion unit 61A exposed from the opening 50W forms a light-receiving region RW of the normal pixel 61W. In the normal pixel 61W, the principal ray of the imaging lens 1 is incident at a center of the light-receiving region RW in the column direction Y and in the row direction X. That is, the normal pixel 61W is a pixel in which an incidence position of the principal ray of the imaging lens 1 matches the center of the light-receiving region RW.

In the light shielding film 50, furthermore, an opening 50R is formed above the photoelectric conversion unit 61A in the phase difference detection pixel 61R, and an opening 50L is formed above the photoelectric conversion unit 61A in the phase difference detection pixel 61L. The opening 50R is in a state where a center CR thereof in the column direction Y and in the row direction X is shifted to a right side in the row direction X from the center of the photoelectric conversion unit 61A in the column direction Y and in the row direction X (that is, the incidence position of the principal ray of the imaging lens 1) in the phase difference detection pixel 61R. The opening 50L is in a state where a center CL thereof in the column direction Y and in the row direction X is shifted to a left side in the row direction X from the center of the photoelectric conversion unit 61A in the column direction Y and in the row direction X (that is, the incidence position of the principal ray of the imaging lens 1) in the phase difference detection pixel 61L.

A region of the photoelectric conversion unit 61A exposed from the opening 50R forms a light-receiving region RR of the phase difference detection pixel 61R. A region of the photoelectric conversion unit 61A exposed from the opening 50L forms a light-receiving region RL of the phase difference detection pixel 61L. The phase difference detection pixel 61R can be said to have a configuration in which the light-receiving region RR is eccentric to a right side of the photoelectric conversion unit 61A in the row direction X. The phase difference detection pixel 61L can be said to have a configuration in which the light-receiving region RL is eccentric to a left side of the photoelectric conversion unit 61A in the row direction X.

Here, an imaginary line obtained by extending an upper end edge (one end edge in the column direction Y) of the opening 50R in the row direction X will be referred to as an imaginary line Lu. An imaginary line obtained by extending a lower end edge (the other end edge in the column direction Y) of the opening 50R in the row direction X will be referred to as an imaginary line Ld. In the phase difference detection pixel 61R, the widest region (a region on a left side of the light-receiving region RR) of a region shielded from light in the photoelectric conversion unit 61A between the imaginary line Lu and the imaginary line Ld will be defined as a light shielding region SR of the photoelectric conversion unit 61A in the phase difference detection pixel 61R.

In addition, in the phase difference detection pixel 61L, the widest region (a region on a right side of the light-receiving region RL) of a region shielded from light in the photoelectric conversion unit 61A between the imaginary line Lu and the imaginary line Ld will be defined as a light shielding region SL of the photoelectric conversion unit 61A in the phase difference detection pixel 61L.

Based on such definitions, the phase difference detection pixel 61R can be said to have a configuration in which the light-receiving region RR and the light shielding region SR are arranged in the row direction X, and in which the light shielding region SR is disposed on the left side of the light-receiving region RR. In addition, the phase difference detection pixel 61L can be said to have a configuration in which the light-receiving region RL and the light shielding region SL are arranged in the row direction X, and in which the light shielding region SL is disposed on the right side of the light-receiving region RL.

In such a manner, pairs of the phase difference detection pixel 61R and the phase difference detection pixel 61L are disposed adjacent to each other in the row direction X in the imaging element 5. The phase difference detection pixel 61R and the phase difference detection pixel 61L that are disposed adjacent to each other in the row direction X have a configuration in which the light-receiving region RR of the phase difference detection pixel 61R and the light-receiving region RL of the phase difference detection pixel 61L are disposed between the light shielding region SR of the phase difference detection pixel 61R and the light shielding region SL of the phase difference detection pixel 61L.

As illustrated in FIG. 4, in the pair of the phase difference detection pixel 61R and the phase difference detection pixel 61L disposed adjacent to each other in a center part (near a position intersecting with an optical axis of the imaging optical system) of the light-receiving surface 60, a boundary between the phase difference detection pixel 61R and the phase difference detection pixel 61L is formed at an intermediate position between a center of the light-receiving region RR in the row direction X and a center of the light-receiving region RL in the row direction X. The pair of the phase difference detection pixel 61R and the phase difference detection pixel 61L illustrated in FIG. 4 constitutes a first pair.

On the other hand, in the pair of the phase difference detection pixel 61R and the phase difference detection pixel 61L disposed adjacent to each other in an edge part (a position close to an edge of the imaging element 5) of the light-receiving surface 60, the intermediate position between the center of the light-receiving region RR in the row direction X and the center of the light-receiving region RL in the row direction X is eccentric to an edge side of the imaging element 5 (a left edge side of the imaging element 5 in the example in FIG. 5; a right edge side of the imaging element 5 in the example in FIG. 6) from the boundary between the phase difference detection pixel 61R and the phase difference detection pixel 61L. Eccentricity of the intermediate position is increased as the intermediate position is closer to the edge of the imaging element 5 (closer to the right end or the left end of the light-receiving surface 60). The pair of the phase difference detection pixel 61R and the phase difference detection pixel 61L in which the intermediate position is eccentric as illustrated in FIG. 5 and in FIG. 6 constitutes a second pair.

According to the imaging element 5 configured in the above manner, for example, by performing a correlation operation between a pixel signal group read out from a plurality of the phase difference detection pixels 61R and a pixel signal group read out from a plurality of the phase difference detection pixels 61L included in the same pixel row 62, a phase difference between the two pixel signal groups in the row direction X can be derived. The position of the principal point of the focus lens can be controlled using the phase difference.

The imaging element 5 has a laterally long shape extending in the row direction X. An angle formed between a ray incident on the light-receiving surface 60 and the optical axis of the imaging optical system will be defined as a light incidence angle. The light incidence angle is larger in a right end part and a left end part of the light-receiving surface 60 than in an upper end part and a lower end part of the light-receiving surface 60. In the imaging element 5, the photoelectric conversion unit 61A has a laterally long shape extending in the row direction X in each pixel 61. Thus, light can be efficiently confined in the normal pixel 61W in the right end part or the left end part of the imaging element 5 in which the light incidence angle is large. In addition, by causing the photoelectric conversion unit 61A to have a laterally long shape, each of the phase difference detection pixel 61R and the phase difference detection pixel 61L can have a light-receiving region that is large in a lateral direction, and sensitivity of the phase difference detection pixels can be improved. Consequently, derivation accuracy of the phase difference is improved, and focal point adjustment can be performed with high accuracy.

In addition, in the imaging element 5, the light-receiving regions of each of the phase difference detection pixel 61R and the phase difference detection pixel 61L of the pair adjacent to each other are disposed near each other in the row direction X. With this configuration, for example, a pixel signal close to a pixel signal read out from the normal pixel 61W can be obtained by adding pixel signals read out from each of the phase difference detection pixel 61R and the phase difference detection pixel 61L of the pair. Accordingly, image quality in generating the captured image data using the pixel signals read out from the phase difference detection pixels can be improved.

It is preferable that a difference between a sum of an area of the light shielding region SR and an area of the light shielding region SL, and a sum of an area of the light-receiving region RR and an area of a light-receiving region RL is less than or equal to a first threshold value (sufficiently small). This difference is ideally zero. By doing so, it is easy to bring the sum of the area of the light-receiving region RR and the sum of the light-receiving region RL close to an area of the light-receiving region RW. Consequently, the image quality in generating the captured image data using the pixel signals read out from the phase difference detection pixels can be improved.

In addition, instead of setting the difference to be less than or equal to the first threshold value, a difference between the sum of the area of the light-receiving region RR and the area of the light-receiving region RL, and the area of the light-receiving region RW may be set to be less than or equal to a second threshold value. This difference is ideally zero. Even by doing so, the image quality in generating the captured image data using the pixel signals read out from the phase difference detection pixels can be improved.

In the imaging element 5, as illustrated in FIG. 5 and in FIG. 6, the area of the light-receiving region RR of the phase difference detection pixel 61R is increased toward a left side of the center of the light-receiving surface 60 in the row direction X. In addition, the area of the light-receiving region RL of the phase difference detection pixel 61L is increased toward a right side of the center of the light-receiving surface 60 in the row direction X. Thus, sensitivity of the phase difference detection pixel 61R and of the phase difference detection pixel 61L is increased even at a location of a high image height, and the derivation accuracy of the phase difference can be improved.

Figure 7:
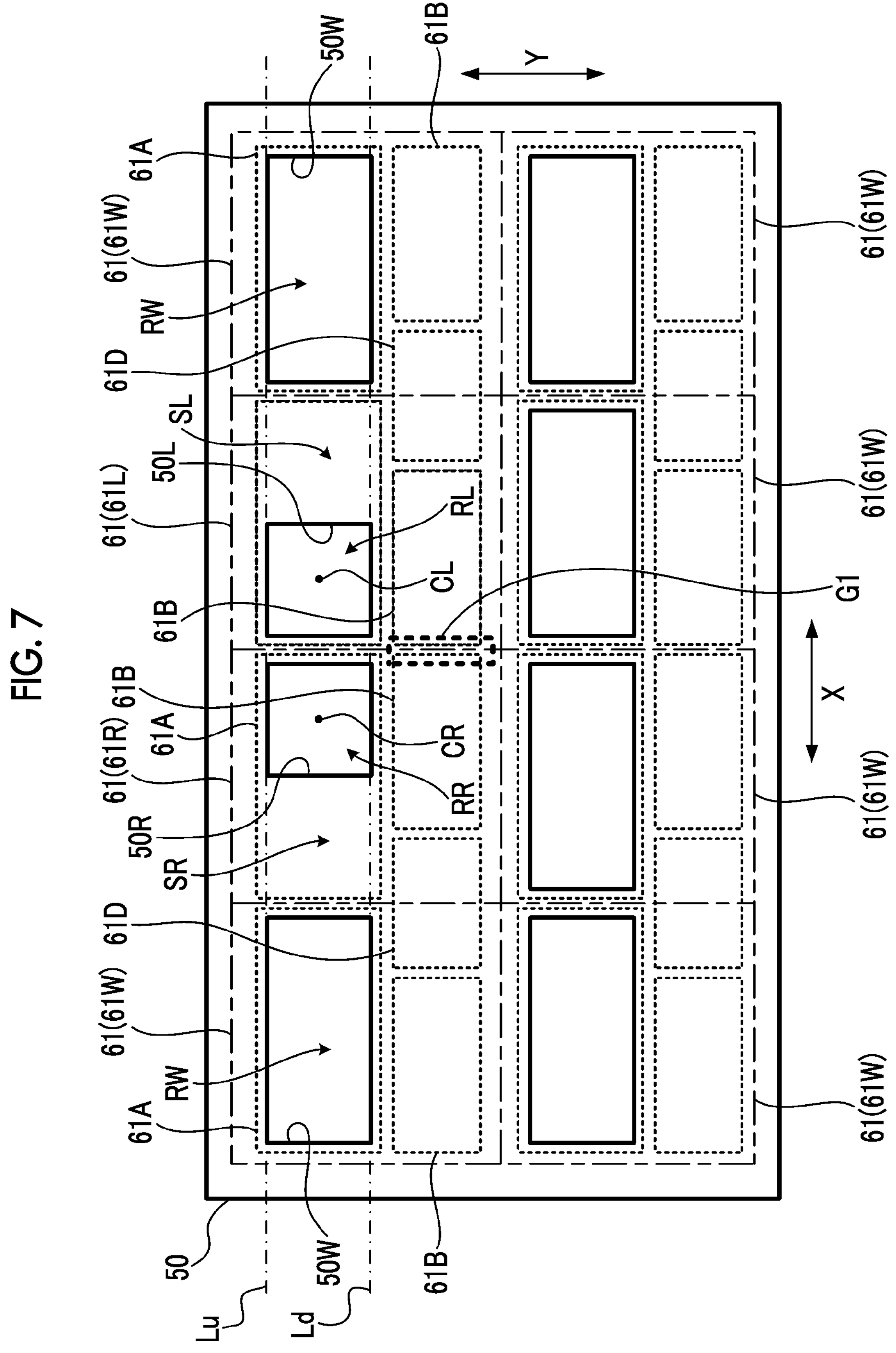
FIG. 7 is a diagram that illustrates a first modification example of the imaging element 5 and that corresponds to FIG. 4.

FIG. 7 is a diagram that illustrates a first modification example of the imaging element 5 and that corresponds to FIG. 4. In a configuration of this modification example, a gate electrode G1 is added between a boundary part between the charge holding units 61B of each of the phase difference detection pixel 61R and the phase difference detection pixel 61L of the pair adjacent to each other, and the light shielding film 50. A potential of the gate electrode G1 is controlled by the drive circuit 63.

In a case where a voltage is applied to the gate electrode G1, a channel is formed in the semiconductor substrate below the gate electrode G1, and a potential barrier at the boundary between the charge holding units 61B of each of the phase difference detection pixel 61R and the phase difference detection pixel 61L of the pair is eliminated. Consequently, the charges held in the charge holding units 61B of each of the phase difference detection pixel 61R and the phase difference detection pixel 61L of the pair can be mixed in the two charge holding units 61B.

According to the modification example illustrated in FIG. 7, since charges can be mixed in the charge holding units 61B, processing can be simplified, compared to a case where the pixel signal of the phase difference detection pixel 61R and the pixel signal of the phase difference detection pixel 61L are added by signal processing.

Figure 8:
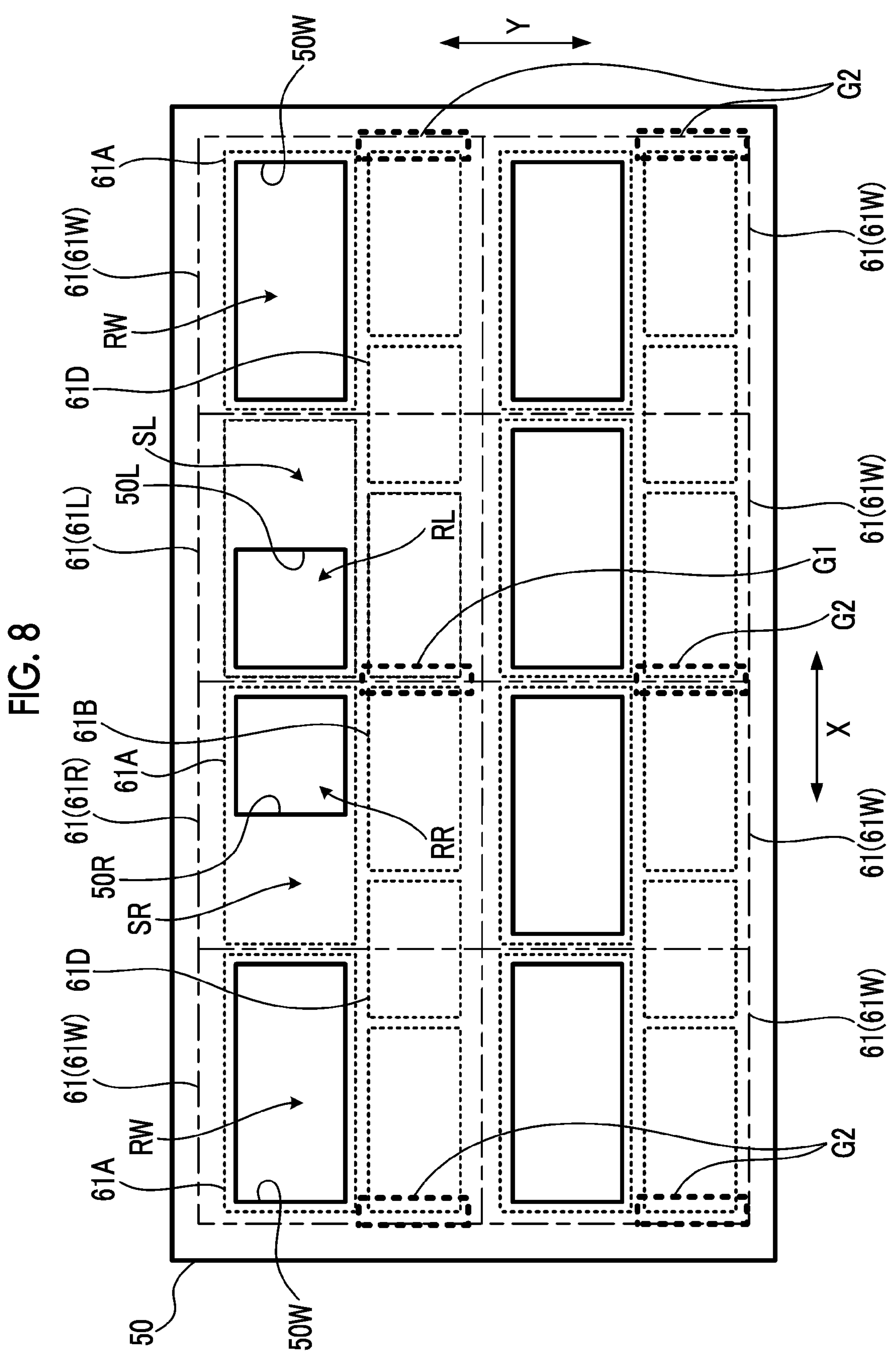
FIG. 8 is a diagram that illustrates a second modification example of the imaging element 5 and that corresponds to FIG. 4.

FIG. 8 is a diagram that illustrates a second modification example of the imaging element 5 and that corresponds to FIG. 4. In a configuration of this modification example, a gate electrode G2 is added between a boundary part between the charge holding units 61B of each of two normal pixels 61W disposed adjacent to each other in the row direction X, and the light shielding film 50 in the configuration illustrated in FIG. 7. A potential of the gate electrode G2 is controlled by the drive circuit 63.

In a case where a voltage is applied to the gate electrode G2, a channel is formed in the semiconductor substrate below the gate electrode G2, and a potential barrier at the boundary between the charge holding units 61B of each of the two normal pixels 61W disposed adjacent to each other in the row direction X is eliminated. Consequently, the charges held in the charge holding units 61B of each of the two normal pixels 61W disposed adjacent to each other in the row direction X can be mixed in the two charge holding units 61B.

According to the modification example illustrated in FIG. 8, charges can be mixed in the charge holding units 61B even in the normal pixels 61W. Thus, high-sensitivity imaging can be performed. In the modification example illustrated in FIG. 8, the gate electrode G1 is not essential and may be omitted.

In the imaging element 5 illustrated in FIG. 2 to FIG. 8, in the second pixel row, among four pixels 61 in two pixel sets adjacent to each other in the row direction X, two pixels 61 that are adjacent to each other across a boundary between the two pixel sets are a pair of the phase difference detection pixel 61R and the phase difference detection pixel 61L. As a modification example, for example, two normal pixels 61W may be disposed between the two pixel sets. That is, the pair of the phase difference detection pixel 61R and the phase difference detection pixel 61L adjacent to each other in the row direction X is said to be a pair of two phase difference detection pixels disposed at the shortest distance in the row direction X.

In addition, in the imaging element 5 illustrated in FIG. 2 to FIG. 8, out of two pixels 61 adjacent to each other across the boundary between the two pixel sets, the one on a left side is the phase difference detection pixel 61R, and the one on a right side is the phase difference detection pixel 61L. As a modification example, out of the two pixels 61, the one on the right side may be the phase difference detection pixel 61R, and the one on the left side may be the phase difference detection pixel 61L. Even in this case, the sensitivity of the phase difference detection pixels can be improved.

In addition, in the imaging element 5 illustrated in FIG. 2 to FIG. 8, the opening 50R and the opening 50L of the phase difference detection pixel 61R and the phase difference detection pixel 61L, respectively, of the pair may be combined into one opening.

In addition, while the first pair and the second pair are included as a pair of the phase difference detection pixels in the configuration of the imaging element 5 illustrated in FIG. 2 to FIG. 8, the first pair is not essential, and all pairs of the phase difference detection pixels may be the second pairs.

Next, a configuration of a smartphone that is another embodiment of the imaging apparatus according to the present invention will be described.

Figure 9:
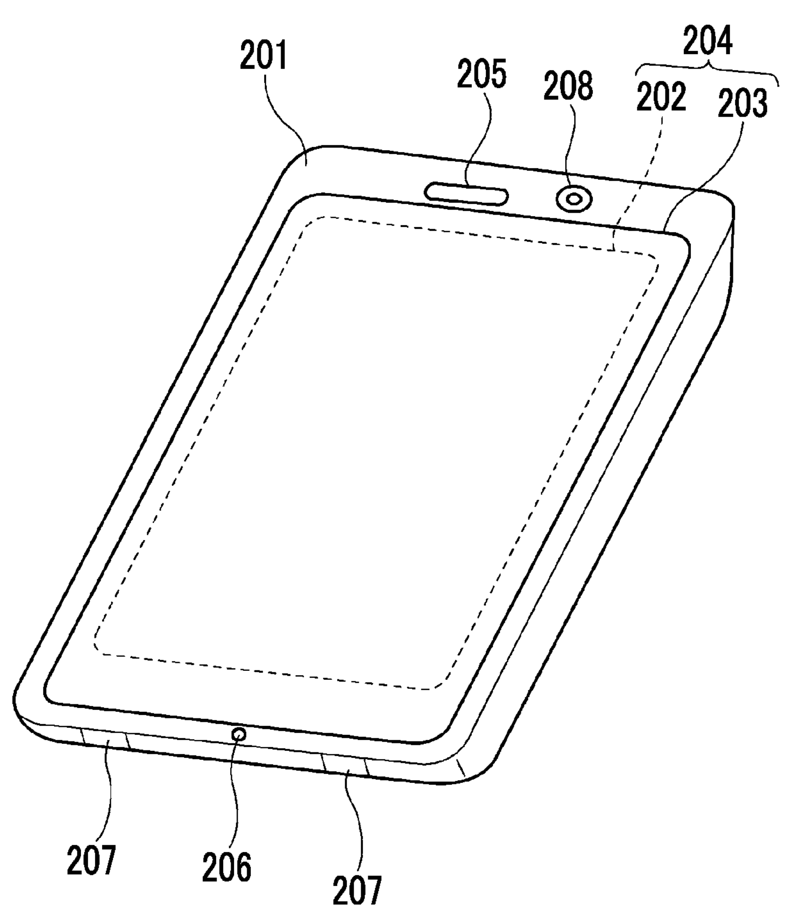
FIG. 9 is a diagram illustrating an exterior of a smartphone 200.

FIG. 9 illustrates an exterior of a smartphone 200. The smartphone 200 illustrated in FIG. 9 includes a casing 201 having a flat plate shape and comprises a display and input unit 204 in which a display panel 202 as a display unit and an operation panel 203 as an input unit are integrated on one surface of the casing 201.

In addition, the casing 201 comprises a speaker 205, a microphone 206, an operation unit 207, and a camera unit 208. The configuration of the casing 201 is not limited thereto and can employ, for example, a configuration in which the display unit and the input unit are independently disposed, or a configuration that has a folded structure or a sliding mechanism.

Figure 10:
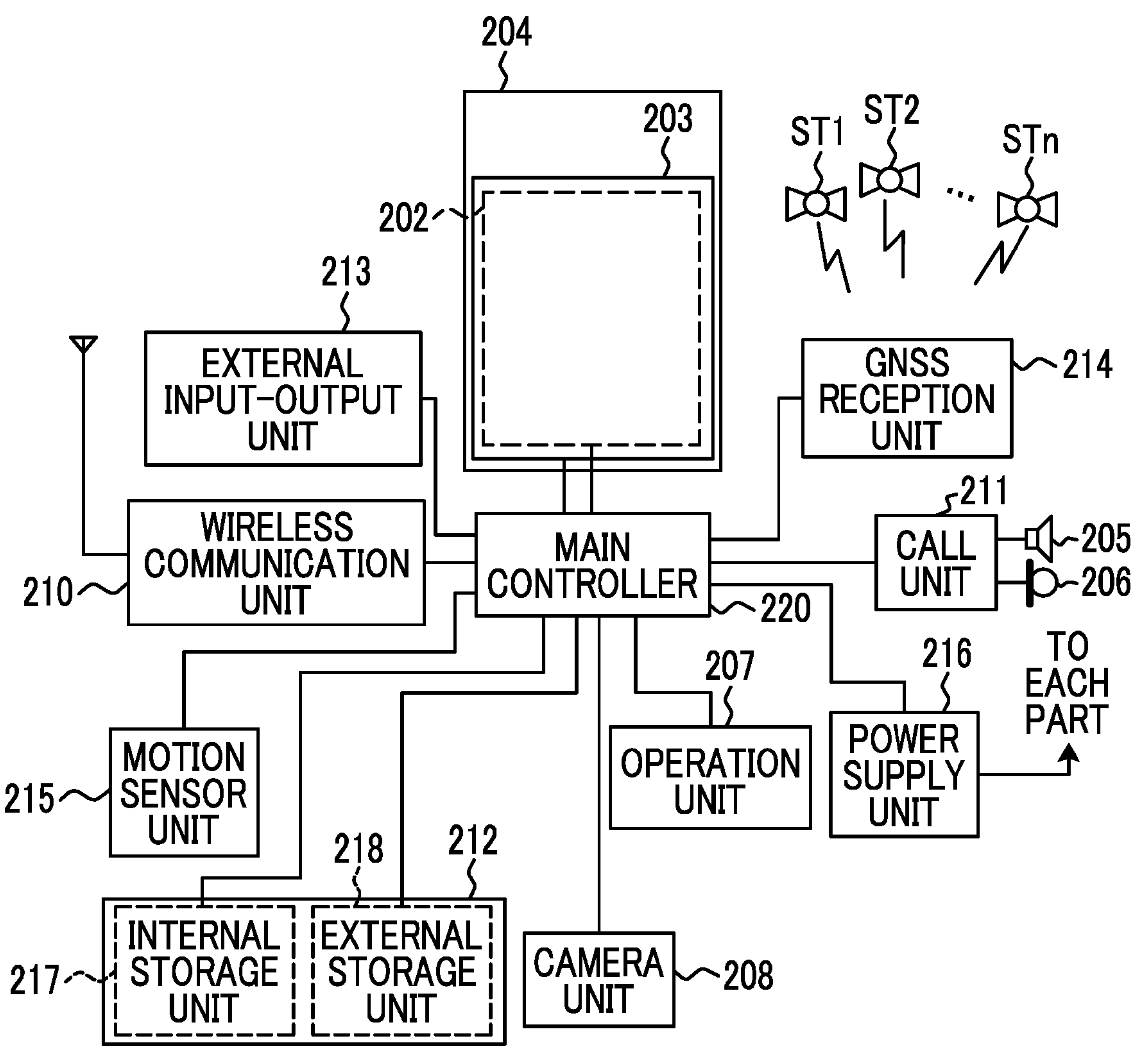
FIG. 10 is a block diagram illustrating a configuration of the smartphone 200 illustrated in FIG. 9.

FIG. 10 is a block diagram illustrating a configuration of the smartphone 200 illustrated in FIG. 9.

As illustrated in FIG. 10, a wireless communication unit 210, the display and input unit 204, a call unit 211, the operation unit 207, the camera unit 208, a storage unit 212, an external input-output unit 213, a global navigation satellite system (GNSS) reception unit 214, a motion sensor unit 215, a power supply unit 216, and a main controller 220 are comprised as main constituents of the smartphone.

In addition, a wireless communication function of performing mobile wireless communication with a base station apparatus BS, not illustrated, through a mobile communication network NW, not illustrated, is provided as a main function of the smartphone 200.

The wireless communication unit 210 performs wireless communication with the base station apparatus BS accommodated in the mobile communication network NW in accordance with an instruction from the main controller 220. By using the wireless communication, transmission and reception of various file data such as audio data and image data, electronic mail data, or the like and reception of web data, streaming data, or the like are performed.

The display and input unit 204 is a so-called touch panel that visually delivers information to the user by displaying images (still images and video images), text information, or the like and that detects a user operation with respect to the displayed information under control of the main controller 220. The display and input unit 204 comprises the display panel 202 and the operation panel 203.

A liquid crystal display (LCD), an organic electro-luminescence display (OELD), or the like is used as a display device in the display panel 202.

The operation panel 203 is a device that is placed such that an image displayed on a display surface of the display panel 202 can be visually recognized, and that detects one or a plurality of coordinates operated with a finger of the user or with a stylus. In a case where the device is operated with the finger of the user or with the stylus, a detection signal generated by the operation is output to the main controller 220. Next, the main controller 220 detects an operation position (coordinates) on the display panel 202 based on the received detection signal.

As illustrated in FIG. 10, while the display panel 202 and the operation panel 203 of the smartphone 200 illustrated as one embodiment of the imaging apparatus according to the present invention are integrated to constitute the display and input unit 204, the operation panel 203 is disposed to completely cover the display panel 202.

In a case where such disposition is employed, the operation panel 203 may have a function of detecting the user operation even in a region outside the display panel 202. In other words, the operation panel 203 may comprise a detection region (hereinafter, referred to as a display region) for an overlapping part overlapping with the display panel 202 and a detection region (hereinafter, referred to as a non-display region) for an outer edge part, other than the overlapping part, that does not overlap with the display panel 202.

A size of the display region and a size of the display panel 202 may completely match, but both sizes do not need to match. In addition, the operation panel 203 may comprise two sensitive regions of the outer edge part and an inner part other than the outer edge part. Furthermore, a width of the outer edge part is appropriately designed depending on a size and the like of the casing 201.

Furthermore, examples of a position detection method employed in the operation panel 203 include a matrix switch method, a resistive membrane system, a surface acoustic wave method, an infrared method, an electromagnetic induction method, and a capacitance method. Any of the methods can be employed.

The call unit 211 comprises the speaker 205 or the microphone 206, and converts voice of the user input through the microphone 206 into audio data processable in the main controller 220 and outputs the audio data to the main controller 220, or decodes audio data received by the wireless communication unit 210 or by the external input-output unit 213 and outputs the decoded audio data from the speaker 205.

In addition, as illustrated in FIG. 9, for example, the speaker 205 can be mounted on the same surface as a surface on which the display and input unit 204 is provided, and the microphone 206 can be mounted on a side surface of the casing 201.

The operation unit 207 is a hardware key that uses a key switch or the like, and receives an instruction from the user. For example, as illustrated in FIG. 9, the operation unit 207 is a push button-type switch that is mounted on a side surface of the casing 201 of the smartphone 200, and that is set to an ON state in a case where the switch is pressed with the finger or the like and is set to an OFF state by restoring force of a spring or the like in a case where the finger is released.

In the storage unit 212, a control program and control data of the main controller 220, application software, address data in which a name, a telephone number, or the like of a communication counterpart is associated, transmitted and received electronic mail data, web data downloaded by web browsing, and downloaded contents data are stored, and streaming data or the like is temporarily stored. In addition, the storage unit 212 is configured with an internal storage unit 217 incorporated in the smartphone and with an external storage unit 218 that includes a slot for an attachable and detachable external memory.

Each of the internal storage unit 217 and the external storage unit 218 constituting the storage unit 212 is implemented using a storage medium such as a memory (for example, a MicroSD (registered trademark) memory) of a flash memory type, a hard disk type, a multimedia card micro type, or a card type, a random access memory (RAM), or a read only memory (ROM).

The external input-output unit 213 functions as an interface with all external apparatuses connected to the smartphone 200 and is directly or indirectly connected to other external apparatuses by communication or the like (for example, a universal serial bus (USB), IEEE1394, Bluetooth (registered trademark), radio frequency identification (RFID), infrared communication (Infrared Data Association (IrDA) (registered trademark)), Ultra Wideband (UWB) (registered trademark), or ZigBee (registered trademark)) or through a network (for example, Ethernet (registered trademark) or a wireless local area network (LAN)).

For example, the external apparatuses connected to the smartphone 200 include a wired/wireless headset, a wired/wireless external charger, a wired/wireless data port, a memory card and a subscriber identity module (SIM)/user identity module (UIM) card connected through a card socket, an external audio and video apparatus connected through an audio and video input/output (I/O) terminal, a wirelessly connected external audio and video apparatus, a smartphone connected in a wired/wireless manner, a personal computer connected in a wired/wireless manner, and an earphone connected in a wired/wireless manner.

The external input-output unit 213 can deliver data transferred from the external apparatuses to each constituent in the smartphone 200 or transfer data in the smartphone 200 to the external apparatuses.

The GNSS reception unit 214 receives GNSS signals transmitted from GNSS satellites ST1 to STn, executes positioning computation processing based on the received plurality of GNSS signals, and detects a position consisting of a latitude, a longitude, and an altitude of the smartphone 200 in accordance with an instruction from the main controller 220. In a case where positional information can be acquired from the wireless communication unit 210 or from the external input-output unit 213 (for example, a wireless LAN), the GNSS reception unit 214 can detect the position using the positional information.

The motion sensor unit 215 comprises, for example, a three-axis acceleration sensor and detects a physical motion of the smartphone 200 in accordance with an instruction from the main controller 220. By detecting the physical motion of the smartphone 200, a movement direction or acceleration of the smartphone 200 is detected. A detection result is output to the main controller 220.

The power supply unit 216 supplies power stored in a battery (not illustrated) to each part of the smartphone 200 in accordance with an instruction from the main controller 220.

The main controller 220 comprises a microprocessor, operates in accordance with the control program and with the control data stored in the storage unit 212, and generally controls each part of the smartphone 200. The microprocessor of the main controller 220 has the same function as the system controller 11. In addition, the main controller 220 has a mobile communication control function of controlling each part of a communication system and an application processing function in order to perform voice communication or data communication through the wireless communication unit 210.

The application processing function is implemented by operating the main controller 220 in accordance with the application software stored in the storage unit 212. For example, the application processing function is an infrared communication function of performing data communication with counter equipment by controlling the external input-output unit 213, an electronic mail function of transmitting and receiving electronic mails, or a web browsing function of viewing a web page.

In addition, the main controller 220 has an image processing function such as displaying an image on the display and input unit 204 based on image data (data of a still image or of a video image) such as reception data or downloaded streaming data.

The image processing function refers to a function of causing the main controller 220 to decode the image data, perform image processing on the decoding result, and display the image on the display and input unit 204.

Furthermore, the main controller 220 executes a display control of the display panel 202 and an operation detection control of detecting the user operation performed through the operation unit 207 and through the operation panel 203.

By executing the display control, the main controller 220 displays an icon for starting the application software or for a software key such as a scroll bar or displays a window for creating an electronic mail.

The scroll bar refers to a software key for receiving an instruction to move a display part of a large image or the like that does not fit in the display region of the display panel 202.

In addition, by executing the operation detection control, the main controller 220 detects the user operation performed through the operation unit 207, receives an operation with respect to the icon and an input of a text string in an input field of the window through the operation panel 203, or receives a request for scrolling the display image made through the scroll bar.

Furthermore, by executing the operation detection control, the main controller 220 is provided with a touch panel control function of determining whether the operation position on the operation panel 203 is in the overlapping part (display region) overlapping with the display panel 202 or is in the other outer edge part (non-display region) not overlapping with the display panel 202 and of controlling the sensitive region of the operation panel 203 or a display position of the software key.

In addition, the main controller 220 can detect a gesture operation with respect to the operation panel 203 and execute a function set in advance in accordance with the detected gesture operation.

The gesture operation is not a simple touch operation in the related art and means an operation of drawing a path with the finger or the like, designating a plurality of positions at the same time, or as a combination thereof, drawing a path for at least one of the plurality of positions.

The camera unit 208 includes the lens device 40, the imaging element 5, and the digital signal processing section 17 illustrated in FIG. 1.

Captured image data generated by the camera unit 208 can be stored in the storage unit 212 or be output through the external input-output unit 213 or through the wireless communication unit 210.

In the smartphone 200 illustrated in FIG. 10, the camera unit 208 is mounted on the same surface as the display and input unit 204. However, a mount position of the camera unit 208 is not limited thereto. The camera unit 208 may be mounted on a rear surface of the display and input unit 204.

In addition, the camera unit 208 can be used in various functions of the smartphone 200. For example, an image acquired by the camera unit 208 can be displayed on the display panel 202, or the image of the camera unit 208 can be used as an operation input of the operation panel 203.

In addition, in detecting the position via the GNSS reception unit 214, the position can be detected by referring to the image from the camera unit 208. Furthermore, by referring to the image from the camera unit 208, it is possible to determine an optical axis direction of the camera unit 208 of the smartphone 200 or to determine the current use environment without using the three-axis acceleration sensor or by using the three-axis acceleration sensor together. The image from the camera unit 208 can also be used in the application software.

In addition, image data of a still image or of a video image to which the positional information acquired by the GNSS reception unit 214, voice information (may be text information acquired by performing voice to text conversion via the main controller or the like) acquired by the microphone 206, posture information acquired by the motion sensor unit 215, or the like is added can be stored in the storage unit 212 or be output through the external input-output unit 213 or through the wireless communication unit 210.

EXPLANATION OF REFERENCES

1: imaging lens
2: stop
4: lens controller
5: imaging element
50: light shielding film
50R, 50L: opening
RW, RR, RL: light-receiving region
SR, SL: light shielding region
CR, CL: center
Lu, Ld: imaginary line
G1, G2: gate electrode
HLE, HC, HRE: range
8: lens drive unit
9: stop drive unit
11: system controller
14, 207: operation unit
15: memory controller
16: memory
17: digital signal processing section
20: external memory controller
21: storage medium
22*a*: display controller
22*b*: display surface
22: display device
24: control bus
25: data bus
40: lens device
60: light-receiving surface

61A: photoelectric conversion unit
61B: charge holding unit
61C: charge transfer unit
61D: floating diffusion
61E: circuit
61: pixel
61W: normal pixel
61R, 61L: phase difference detection pixel
62: pixel row
63: drive circuit
64: signal processing circuit
65: signal line
70: N-type substrate
71: P-well layer
72: electrode
73: N-type impurity layer
74: P-type impurity layer
75: region
76: transfer electrode
77: reset transistor
78: output transistor
79: selection transistor
100A: body part
100: digital camera
200: smartphone
201: casing
202: display panel
203: operation panel
204: display and input unit
205: speaker
206: microphone
208: camera unit
210: wireless communication unit
211: call unit
212: storage unit
213: external input-output unit
214: GNSS reception unit
215: motion sensor unit
216: power supply unit
217: internal storage unit
218: external storage unit
220: main controller

What is claimed is:

1. An imaging element comprising:

a plurality of pixels arranged in a first direction and a second direction intersecting with the first direction, each of the plurality of pixels comprises:

a photoelectric conversion unit;

a charge holding unit that holds charges transferred from the photoelectric conversion unit; and a voltage conversion unit that converts charges transferred from the charge holding unit into voltage, wherein the photoelectric conversion unit and the charge holding unit are arranged in the first direction, the charge holding unit and the voltage conversion unit are arranged in the second direction, the plurality of pixels include a first pixel, in the photoelectric conversion unit of the first pixel, a light-receiving region and a light shielding region are arranged in the second direction, and a width of the photoelectric conversion unit in the second direction is larger than a width of the charge holding unit in the second direction.

2. The imaging element according to claim 1, wherein the second direction is a longitudinal direction of the imaging element.

3. The imaging element according to claim 1, wherein charges held in the charge holding unit of one of two of the first pixels disposed adjacent to each other in the second direction and charges held in the charge holding unit of other of the two of the first pixels are configured to be capable of being mixed in the charge holding units of the two of the first pixels.

4. The imaging element according to claim 1, wherein the first pixel includes a first type pixel in which the light-receiving region is disposed on one side in the second direction and in which the light shielding region is disposed on other side in the second direction, and a second type pixel in which the light-receiving region is disposed on the other side in the second direction and in which the light shielding region is disposed on the one side in the second direction, and in the first type pixel and the second type pixel disposed adjacent to each other in the second direction, the light-receiving region of the first type pixel and the light-receiving region of the second type pixel are disposed between the light shielding region of the first type pixel and the light shielding region of the second type pixel.

5. The imaging element according to claim 4, which comprises pairs of the first type pixel and the second type pixel adjacent to each other in the second direction, wherein the pairs include a first pair, and in the first pair, a boundary between the light-receiving regions is formed at an intermediate position between a center of the light-receiving region of the first type pixel and a center of the light-receiving region of the second type pixel.

6. The imaging element according to claim 4, which comprises pairs of the first type pixel and the second type pixel, wherein the pairs include a second pair, and in the second pair, an intermediate position between a center of the light-receiving region of the first type pixel and a center of the light-receiving region of the second type pixel is eccentric to an edge side of the imaging element from a boundary between the light-receiving regions.

7. The imaging element according to claim 6, wherein an amount of eccentricity of the intermediate position in the second pair is increased as the intermediate position is closer to an edge of the imaging element.

8. An imaging apparatus comprising:

the imaging element according to claim 1.

9. An imaging element comprising:

a plurality of pixels arranged in a first direction and a second direction intersecting with the first direction, each of the plurality of pixels comprises:

a photoelectric conversion unit;

a charge holding unit that holds charges transferred from the photoelectric conversion unit; and, a voltage conversion unit that converts charges transferred from the charge holding unit into voltage, wherein the photoelectric conversion unit and the charge holding unit are arranged in the first direction, the charge holding unit and the voltage conversion unit are arranged in the second direction, the plurality of pixels include a first pixel, in the photoelectric conversion unit of the first pixel, a light-receiving region and a light shielding region are arranged in a second direction intersecting with the first direction, the first pixel includes a first type pixel in which the light-receiving region is disposed on one side in the second direction and in which the light shielding region is disposed on other side in the second direction, and a second type pixel in which the light-receiving region is disposed on the other side in the second direction and in which the light shielding region is disposed on the one side in the second direction, and in the first type pixel and the second type pixel disposed adjacent to each other in the second direction, the light-receiving region of the first type pixel and the light-receiving region of the second type pixel are disposed between the light shielding region of the first type pixel and the light shielding region of the second type pixel.

10. An imaging element comprising:

a plurality of pixels arranged in a first direction and a second direction intersecting with the first direction, each of the plurality of pixels comprises:

a photoelectric conversion unit;

a charge holding unit that holds charges transferred from the photoelectric conversion unit; and a voltage conversion unit that converts charges transferred from the charge holding unit into voltage, wherein the photoelectric conversion unit and the charge holding unit are arranged in the first direction, the charge holding unit and the voltage conversion unit are arranged in the second direction, charges held in the charge holding unit of one of two of the pixels disposed adjacent to each other in a second direction intersecting with the first direction and charges held in the charge holding unit of other of the two of the pixels are configured to be capable of being mixed in the charge holding units of the two of the pixels.

* * * * *